United States Patent [19]

Holzer

[11] Patent Number: 5,568,093
[45] Date of Patent: Oct. 22, 1996

[54] EFFICIENT, HIGH FREQUENCY, CLASS A-B AMPLIFIER FOR TRANSLATING LOW VOLTAGE CLOCK SIGNAL LEVELS TO CMOS LOGIC LEVELS

[75] Inventor: Reuven Holzer, Herzlia, Israel

[73] Assignee: National Semiconductor Corporation, Del.

[21] Appl. No.: 443,955

[22] Filed: May 18, 1995

[51] Int. Cl.$^6$ .................................................. H03F 3/30
[52] U.S. Cl. ...................................... 330/264; 331/116 FE
[58] Field of Search ....................... 330/264; 331/116 FE

[56] References Cited

U.S. PATENT DOCUMENTS

| | | | |
|---|---|---|---|
| 4,013,979 | 3/1977 | Vittoz | 331/108 |
| 4,352,073 | 9/1982 | Leuthold | 331/116 FE X |
| 4,360,789 | 11/1982 | Lewyn et al. | 331/109 |
| 4,387,349 | 6/1983 | Rapp | 331/116 |
| 4,459,565 | 7/1984 | Leach | 331/116 FE |

OTHER PUBLICATIONS

Vittoz, "Quartz Oscillators For Watches", 10th International Congress of Chronometry, Sep. 11–14, 1979, pp. 131–140.
Vittoz et al., "Low–Power/Low–Voltage IC Design," Electronics Laboratories Advanced Engineering Course, Ecole Polytechnique Federale de Lausanne, Lausanne–Switzerland, Jun. 27, 1994, pp. 13–14.

Primary Examiner—James B. Mullins
Attorney, Agent, or Firm—Skjerven, Morrill, MacPherson, Franklin & Friel; Paul J. Winters; David T. Millers

[57] ABSTRACT

A power efficient class A-B amplifier provides 20 dB amplification for a low capacitive load such as a 40 to 80 MHz clock signal in a crystal oscillator circuit. The amplifier includes two bias-and-clamp circuits coupled between an input stage and the gates of an N-channel transistor and a P-channel transistor. The N-channel and P-channel transistors are connected in series between VCC and ground and form an output stage. The bias-and-clamp circuits bias the N-channel and P-channel transistors in weak inversion for maximum amplification and clamp an input voltage to increase noise immunity and reduce power use. In one embodiment, each bias-and-clamp circuit includes two pairs of series connected transistors. A first pair is connected in series with a constant current source and form current mirrors with a second pair of transistors. A node between transistors in the second pair is connected to the gate of a transistor in the output stage and to the input voltage. Transistors in the bias-and-clamp circuits have a conductivity type which matches the conductivity type of the transistor in the output stage which the bias-and-clamp circuit controls.

23 Claims, 4 Drawing Sheets

EFFICIENT, HIGH FREQUENCY, CLASS A-B AMPLIFIER FOR TRANSLATING LOW VOLTAGE CLOCK SIGNAL LEVELS TO CMOS LOGIC LEVELS

BACKGROUND OF THE INVENTION

1. Field of the Invention

This invention relates to amplifiers for translating low voltage clock signals to CMOS levels suitable for integrated circuit logic.

2. Description of Related Art

Crystal oscillator circuits generate clock signals in many applications. FIG. 1 shows an example of a crystal oscillator circuit 100. Oscillator circuit 100 contains a current source 110, a transistor 120, and a crystal 130. Transistor 120 has its gate and drain coupled to the terminals of crystal 130 to create a positive feedback loop. Crystal 130, commonly a quartz crystal, resonates at a characteristic frequency which generates a periodic signal Vin across transistor 120. In order to maintain low current consumption in the oscillator circuit 100, signal Vin has small voltage swings that are insufficient for operation of CMOS logic. Accordingly, an amplifier 160 is required to generate from signal Vin an output signal Vout which oscillates between maximum and minimum levels which are sufficient to switch N-channel and P-channel transistors in CMOS logic.

Since very low power applications such as electronic watches often employ oscillator circuits, amplifier 160 is often required to be power efficient. Power efficient operation becomes more difficult at higher frequencies because faster switching and/or greater amplification is required. Accordingly, efficient high frequency amplifiers are needed.

SUMMARY OF THE INVENTION

In accordance with the invention, a power efficient amplifier includes an output stage containing a P-channel transistor and an N-channel transistor in series between a supply voltage VCC and ground, a first bias-and-clamp circuit for the P-channel circuit, a second bias-and-clamp circuit for the N-channel circuit, and an input stage coupled to the gates of the P-channel and N-channel transistors. The first bias-and-clamp circuit clamps or limits voltage applied to the gate of the P-channel transistor so that the gate voltage is less than a fixed bias voltage for the P-channel transistor. The second bias-and-clamp circuit clamps or limits voltage applied to the gate of the N-channel transistor so that the gate voltage is greater than a fixed bias voltage for the N-channel transistor. Typically, the bias voltages are selected so that the P-channel and N-channel transistors operate in a weak inversion mode where amplification is maximum but current is small.

In one embodiment of the invention, the first bias-and-clamp circuit contains four P-channel transistors. Two of the P-channel transistors are connected in series between supply voltage VCC and ground, and a node between the two transistors is connected to the input stage and to the gate of the P-channel transistor in the output stage. The other two P-channel transistors in the first bias-and-clamp circuit are connected in series which each other and with a first constant current source. Gates and drains of the second pair of P-channel transistors connect to gates of the first pair of P-channel transistors to form current mirrors. When the input voltage rises, the current mirrors are unbalanced and current through a P-channel transistor in the first bias-and-clamp circuit increases to oppose the increase in the gate voltage of the P-channel transistor in the output stage.

The second bias-and-clamp circuit contains four N-channel transistors. Two of the N-channel transistors are connected in series between supply voltage VCC and ground with the gate of the N-channel transistor in the output stage coupled to a node between the two transistors. The other two N-channel transistors are connected in series with a second constant current source, and the two pairs of N-channel transistors are connected to form current mirrors. When the input voltage drops, the current mirrors are umbalanced, and current through an N-channel transistor in the first pair increases to oppose the drop in the gate voltage of the N-channel transistor in the output stage.

An alternative embodiment of the invention uses a single current source connected to both bias-and-clamp circuits. With a single current source, the response of the first and second bias-and-clamp circuits and the P-channel and N-channel transistors in the output stage can be better and more easily matched. Cascoding devices can be added in series with the N-channel and P-channel transistors in the output stage in embodiments with a single current source or with separate current sources for the bias-and-clamp circuits.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
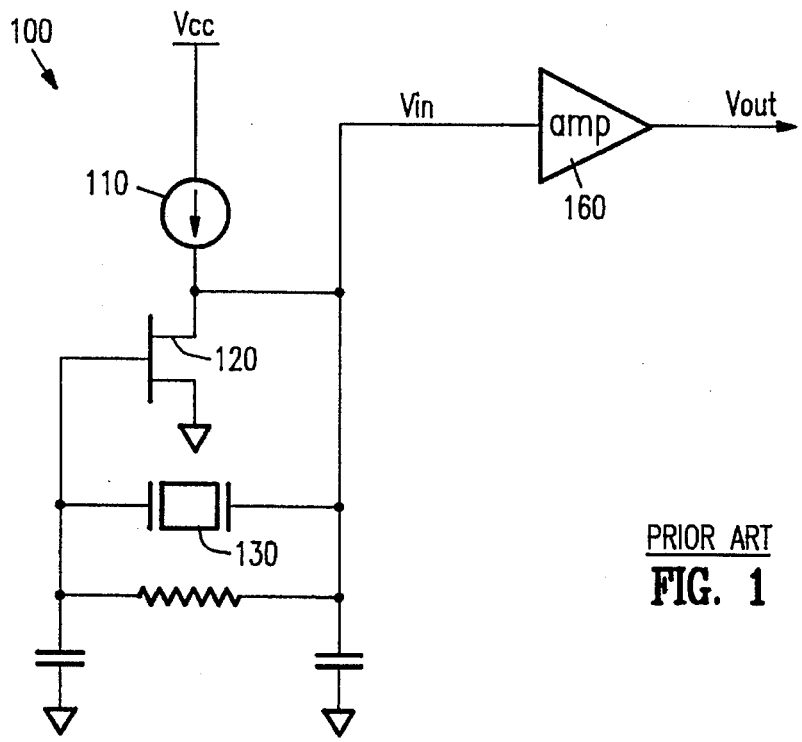
FIG. 1 shows a block diagram of a crystal oscillator circuit with an amplifier.

In accordance with the invention, a power efficient class A-B amplifier translates a high frequency input signal Vin to logic levels required by conventional digital circuits. Amplifiers in accordance with the invention may be used in low power crystal oscillator circuits such a shown in FIG. 1. In the embodiment of FIG. 1, crystal 130 and transistor 120 generate a signal Vin which has a fixed DC component in the range between 0.5 volts and 1.5 volts (depending the sizes of circuit components) and an AC component with an amplitude in the range of about 0.3 to 1.5 volts at a frequency between about 5 and 100 MHz. The desired output signal Vout from amplifier 160 swings from near a supply voltage VCC to ground so that signal Vout can switch N-channel and P-channel transistors in CMOS logic.

An embodiment of an amplifier in accordance with the invention can replace amplifier 160 in FIG. 1. However, amplifiers in accordance with the invention are not limited to particular oscillator circuits or to particular input voltages. Different embodiments of the invention can operate with an input voltage Vin having any fixed DC voltage between a reference voltage (ground) and a supply voltage VCC. An embodiment of an amplifier for a particular oscillator circuit has component sizes selected for the particular input voltage Vin provided by the oscillator circuit.

Figure 2:
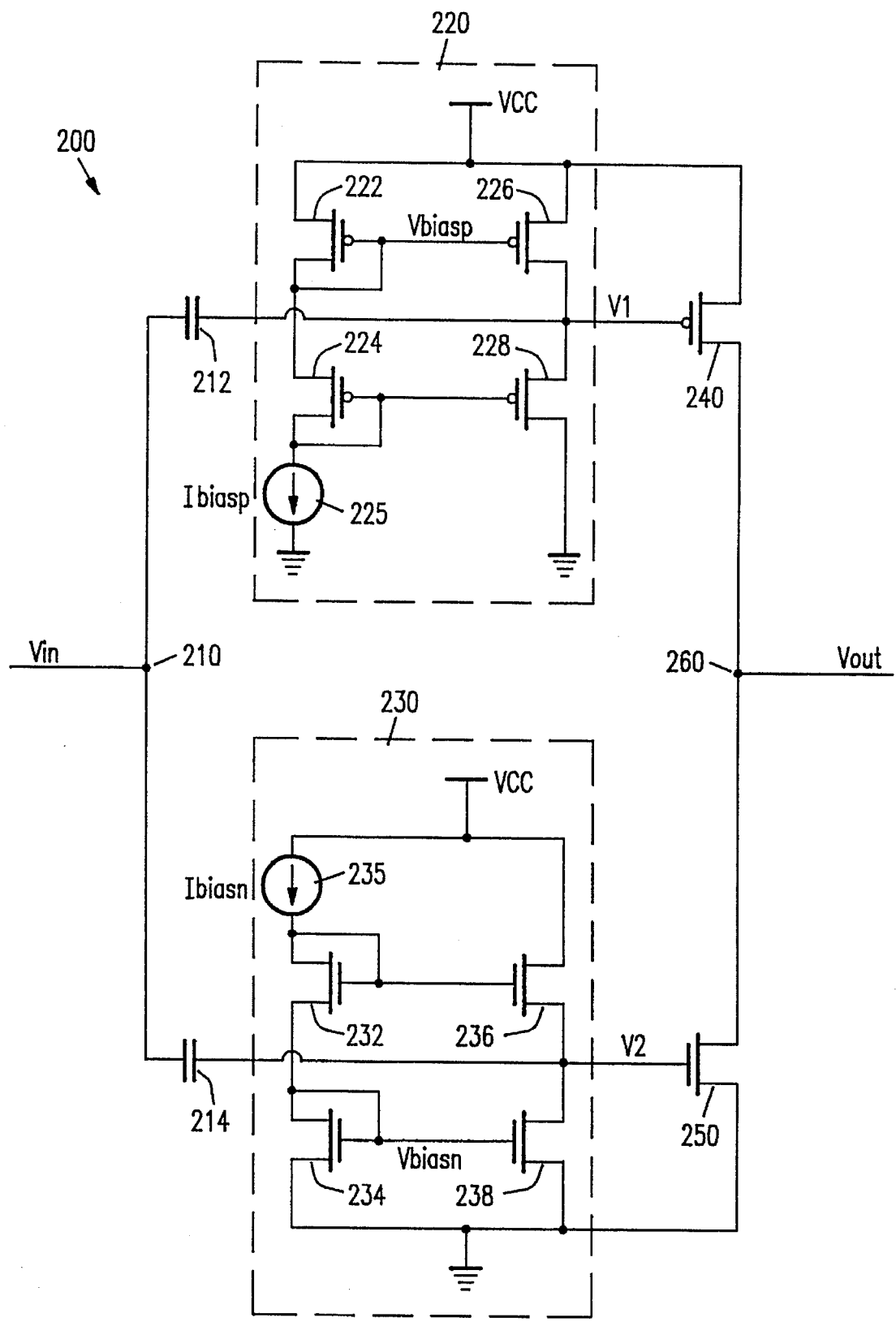
FIG. 2 is a circuit diagram of an amplifier in accordance with an embodiment of the invention.

FIG. 2 shows a circuit diagram of an amplifier 200 in accordance with an embodiment of the invention. Amplifier 200 has an input stage, an output stage, and bias-and-clamp circuits 220 and 230 which connect to the input stage and the output stage. The output stage contains a P-channel transistor 240 and an N-channel transistor 250 which are connected in series between supply voltage VCC and ground. Output signal Vout, being from an output node 260 between transistors 240 and 250, has a voltage level that depends on the conductances of transistors 240 and 250. The conductances of transistors 240 and 250 depends on gate voltages V1 and V2 of transistors 240 and 250.

Bias-and-clamp circuits 220 and 230 couple to input signal Vin via capacitors 212 and 214 and apply to transistors 240 and 250 gate voltages V1 and V2 which depend upon input signal Vin. When voltage Vin is at a positive peak, voltages V1 and V2 are also at positive peaks which causes P-channel transistor 240 to have minimum conductance and transistor 250 to have maximum conductance. Thus, N-channel transistor 250 lowers output voltage Vout to nearly the ground potential. When input voltage Vin drops to its lowest level, P-channel transistor 240 has maximum conductance, and N-channel transistor 250 has minimum conductance which increases output voltage Vout nearly to supply voltage VCC.

Figure 3:
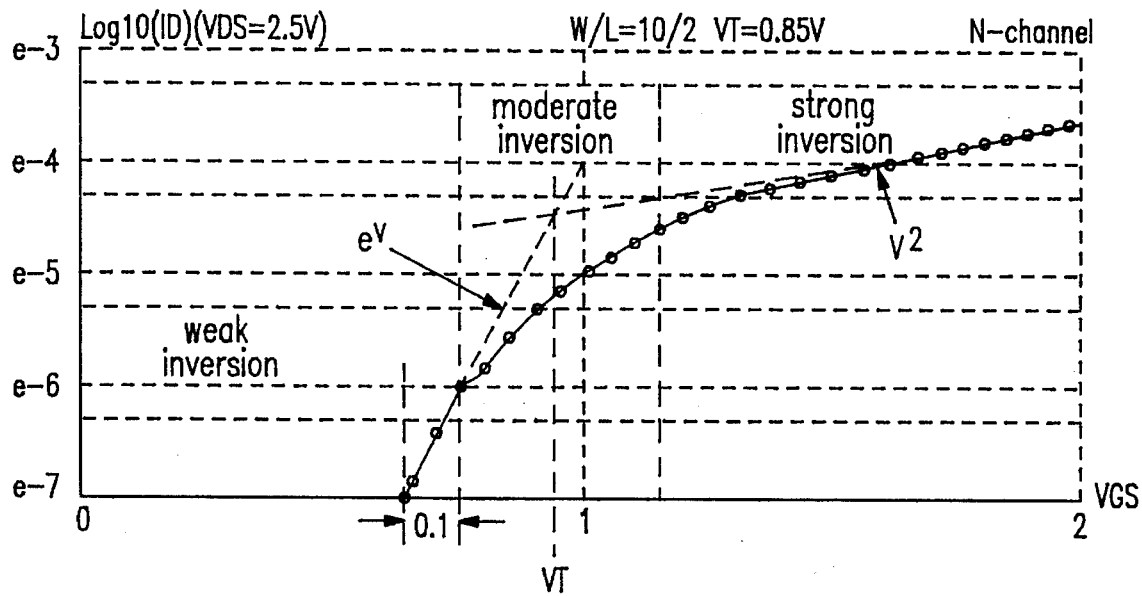
FIG. 3 shows a plot of gate-to-source voltage verses current for a transistor and indicates the desired bias region for a transistor employed in the amplifier of FIG. 2.

The amplification and operating mode of transistors 240 and 250 depends on voltages V1 and V2. Bias-and-clamp circuits 220 and 230 apply gate voltages V1 and V2 and bias transistors 240 and 250 at a weak or moderate inversion. In the weak inversion, a shallow inversion layer containing few charge carriers forms in the channel of the transistor, and amplification is maximized because the change in current ID per change in gate-to-source voltage VGS is largest. FIG. 3 shows a plot of drain current ID verses gate-to-source voltage VGS for a simulation of an N-channel field effect transistor having a threshold voltage VT of 0.85 volts and a channel width-to-length ratio W/L of 10/2. The weak inversion regions is below the threshold voltage VT of the N-channel transistor. For a typical N-channel transistor, weak inversion occurs for gate-to-source voltage VGS in a range between VT—0.4 volts and VT—0.1 volts, but more generally, the boundaries of the weak inversion region depend on the physics of the transistor including factors such as channel doping concentration. P-channel transistors have similar weak inversion regions where the gate-to-source voltage of a P-channel transistor is above the threshold voltage of the P-channel transistor.

Currents through transistors 240 and 250 are small throughout the range of input signal Vin. The current drawn in a specific embodiment depends on swings in signals Vin and the sizes of transistors 240 and 250. Near minimum or maximum voltages for signal Vin, conductance of transistor 240 or 250 is near its maximum, and the conductance of the other of transistor 250 or 240 is near its minimum so that current through the output stage is small. Near the middle of the voltage range for signal Vin, both transistors 240 and 250 conduct, but biasing transistors 240 and 250 in the weak inversion causes current to be relatively small. When the amplitude of the AC component of signal Vin increases, rising and falling times of signal Vout decrease and reduce the time when both transistors 240 and 250 conduct; but at high enough AC amplitudes, efficiency of amplifier 200 begins to drop because gate voltages change in proportion to the AC amplitude and transistors 240 and 250 conduct more current at the same time.

Bias-and-clamp circuit 220 contains P-channel transistors 222, 224, 226, and 228 and constant current source 225. Transistors 226 and 228 are connected in series between supply voltage VCC and ground with the drain of transistor 226 and the source of transistor 228 connected to the gate of transistor 240. Transistors 222 and 224 and constant current source 225 are connected in series between supply voltage VCC and ground. The gate and drain of transistor 222 are connected to the gate of transistor 226 forming a current mirror. The gate and drain of transistor 224 couple to the gate of transistor 228 forming a second current mirror.

Current source 225 is a conventional current source such as are well known in the art. Current source 225 causes a constant current Ibiasp through transistors 222 and 224. Current Ibaiap is selected to be small, typically an order of magnitude smaller than the current through transistors 240 and 250 so that transistors 222 and 224 are nearly off and bias-and-clamp circuit 220 uses very little power. Current Ibiasp is mirrored to transistors 226 and 228 so that a nearly constant bias voltage Vbiasp is applied to the gate of transistor 226. Voltage Vbiasp biases transistor 226 in weak inversion.

Currents through transistors 226 and 228 clamp or limit voltage V1 to a range near voltage Vbiasp. If the AC component of signal Vin causes voltage V1 to rises above voltage Vbiasp, current through transistor 228 increases to discharge capacitor 212 and oppose the increase in voltage V1. If noise causes a voltage spike in signal Vin, current through P-channel transistor 228 becomes large and limits voltage V1 so that the gate-to-source voltage VGS of transistor 228 is about equal to bias voltage Vbiasp of transistor 228. Accordingly, bias-and-clamp circuit 220 clamps voltage spikes which causes output signal Vout to be less sensitive to noise. When voltage Vin reaches a positive peak and begins to drop, transistor 228 enters cutoff and current through transistor 226 charges capacitor 212 to oppose the drop in voltage V1 with constant small current.

Bias-and-clamp circuit 220 contains P-channel transistors which allows current Ibiasp to be low to conserve power while still providing a bias voltage Vbiasp which keeps transistor 240 in weak inversion. Bias-and-clamp circuit 230 is similar to bias-and-clamp circuit 220 in construction and operation but differs in that bias-and-clamp circuit 230 contains N-channel transistors, instead of P-channel transistors, to bias N-channel transistor 250.

Bias-and-clamp circuit 230 contains N-channel transistors 232, 234, 236, and 238 and a constant current source 235. Transistors 236 and 238 are connected in series between supply voltage VCC and ground with the gate of transistor 250 connected to a node between transistors 236 and 238. Transistors 232 and 234 and constant current source 235 are also connected in series between supply voltage VCC and ground, and the gates and drains of transistors 232 and 234 are connected to form current mirrors with transistors 236 and 238 respectively. A constant current Ibiasn from current source 235 is selected so that transistors 233 and 234 are nearly off and a bias voltage Vbiasn biases transistor 238 in a weak inversion mode.

The conductances of and currents through transistors 240 and 250 should be balanced for proper operation. In particular, when input signal Vin is constant, the current through transistor 240 must be equal to the current through transistor 250 to maintain a constant output signal Vout. Further, the amplification of transistors 240 and 250 should be matched to provide the equal responses at the leading and trailing edges of clock pulses.

Figure 4:
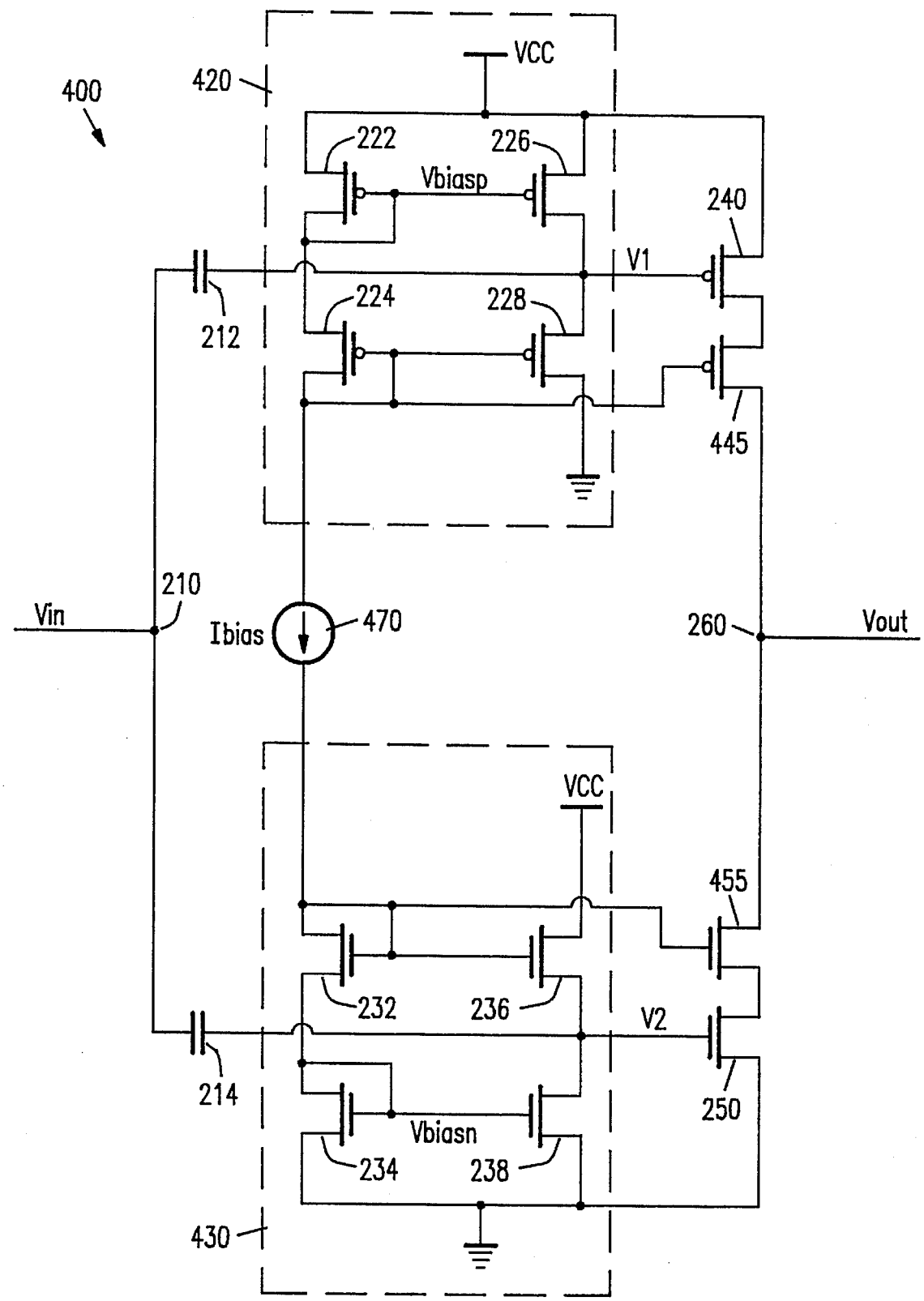
FIG. 4 is a circuit diagram of an amplifier in accordance with another embodiment of the invention.

FIG. 4 is a circuit diagram of an amplifier 400 with improved balance. Many of the elements in of amplifier 400 have the same functions and reference symbols as elements described above in regard to amplifier 200 of FIG. 2. The above description of those elements also applies to FIG. 4. A difference between amplifier 400 and amplifier 200 is that a single constant current source 470 for both bias-and-clamp circuits 420 and 430 in amplifier 400 replaces current sources 225 and 235 of amplifier 200. Current source 470 ensures the same current Ibias flows through P-channel transistors 422 and 424 and N-channel transistors 432 and 434. Accordingly, the difference between currents Ibiasp and Ibiasn is eliminated as a variable which could change the balance of the conductances of transistors 240 and 250.

Additions to amplifier 400 include a P-channel cascoding transistor 445 coupled between P-channel transistor 240 and output node 260 and an N-channel cascoding transistor 455 between transistor 250 and output node 260. Transistors 445 and 455 have gates coupled to the gates of transistors 224 and 232 respectively to form current mirrors. Cascoding transistors 445 and 455 increase amplification, increase output impedance, and reduce the effective gate capacitance of transistors 240 and 250 because drain voltages of transistors 240 and 250 are kept nearer to voltages Vbiasp and Vbiasn respectively. This reduces switching time when voltages V1 and V2 change.

The elements of amplifier 400 have sizes selected so that (1) voltages Vbiasp and Vbiasn bias transistors 240 and 250 in weak inversion, (2) amplification and response time of amplifier 400 is suitable for the particular frequency, DC component, and AC component of input voltage Vin, and (3) amplification and performance of P-channel transistors 240 and 445 match amplification and performance of N-channel transistors 250 and 455. Accordingly, the sizes of the elements depend on the particular application. These sizes can be selected using conventional circuit simulation techniques.

In one example embodiment of the invention, supply voltage VCC is about 5 volts. Input signal Vin has a DC level of 1 volt and an AC component with a frequency of 40 MHz and a peak-to-peak voltage of 0.5 volts. Current Ibias is about 0.75 µA. Capacitors 212 and 214 are 3.5 pF and 2.9 pF. In bias-and-clamp circuit 420, P-channel transistors 222, 224, 226, and 228 have channel width to length ratios of 12/1, 6/1, 24/1, and 12/1, respectively for a 1 µm channel length. In bias-and-clamp circuit 430, N-channel transistors 232, 234, 236, and 238 have channel width to length ration of 2.6/1, 5.2/1, 5.2/1, and 10.4/1, respectively. Output transistors 240 and 250 have channel width to length ratios of 150/1 and 40/1, respectively. Cascoding transistors 445 and 455 have channel to width ratios of 75/1 and 20/1, respectively.

Figure 5:
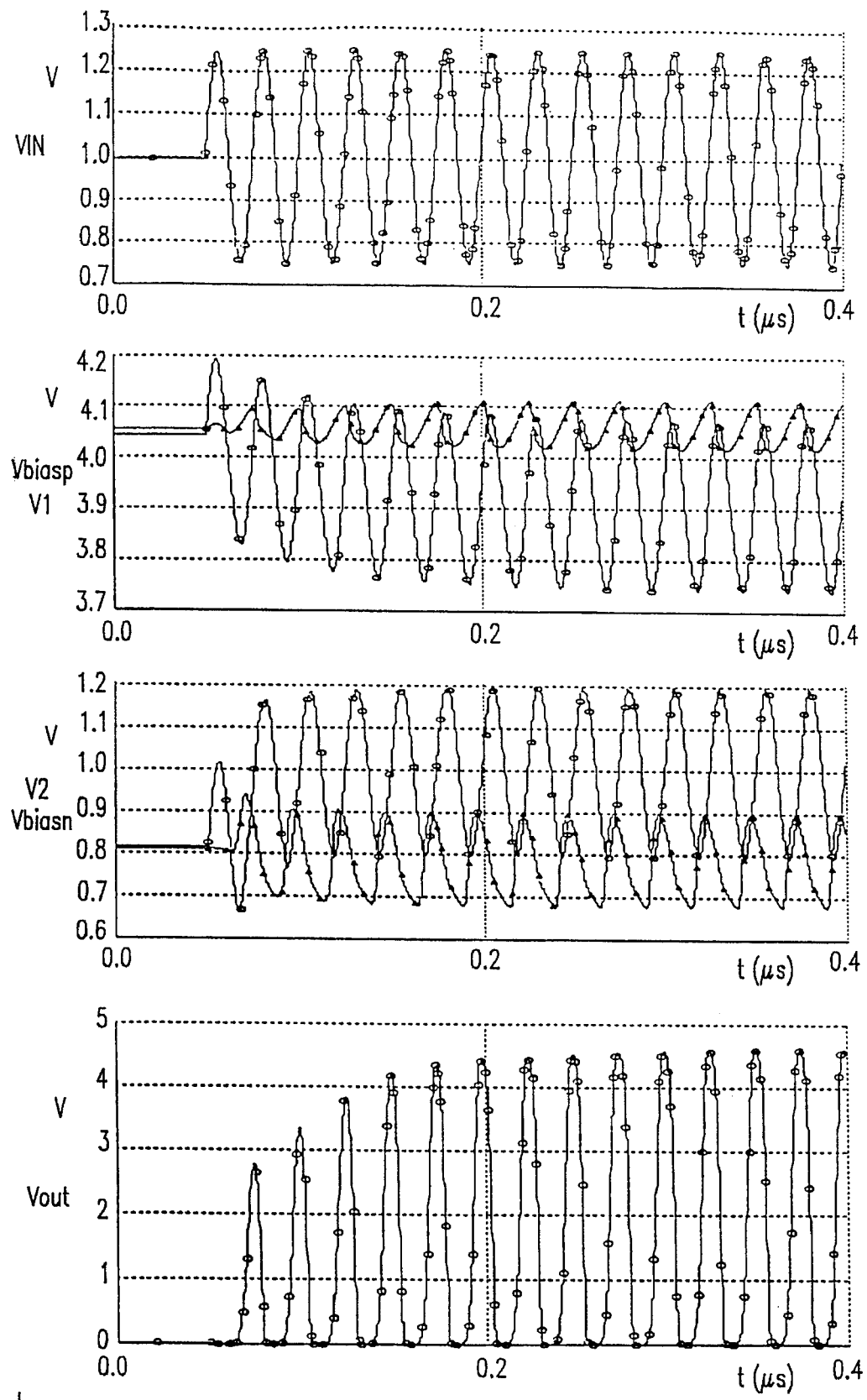
FIG. 5 shows plots of input, internal, and output voltages for the amplifier of FIG. 4.

FIG. 5 shows plots of input, output, and internal signals determined from a simulation of the example embodiment of amplifier 400. Input signal Vin has a DC component at a level of 1 volt. After 50 ns, an AC component which is a sine wave with an amplitude of 0.25 volts (0.5 volts peak-to-peak) and a frequency of 40 MHz begins. After an initial transient period, bias-and-clamp circuit 420 clamps voltage V1 to less that a fixed level which is about equal to the DC level of voltage Vbiasp (4.1 volts). Similarly, bias-and-clamp circuit 430 clamps voltage V2 to voltages greater than a fixed level that about equal to the DC level of voltage Vbiasn (0.8 volts). Capacitive coupling through transistors 226 and 238 cause voltage V1 to affect to voltage Vbiasp and voltage V2 to affect to voltage Vbiasn.

Differences in the operation of P-channel transistor 240 and N-channel transistor 250 make the peaks of output signal Vout less than supply voltage VCC (5 volts in FIG. 5). However, signal Vout is sufficient for operation of conventional CMOS logic. An inverter connected to output node 260 could increase the voltage swing if desired.

Although the present invention has been described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

I claim:

1. An amplifier comprising:

an input node;

a first transistor and a second transistor, each having a gate coupled to the input node, wherein the first and second transistors are coupled in series between a supply voltage and a reference voltage and the first transistor has a conductivity type that is complementary to that of the second transistor;

an output node between the first and second transistors;

a first bias circuit coupled to the gate of the first transistor, wherein the first bias circuit biases the gate of the first transistor so that a gate-source voltage of the first transistor is offset from a threshold voltage of the first transistor and the first transistor operates in weak inversion mode; and a second bias circuit coupled to the gate of the second transistor, wherein the second bias circuit biases the gate of the second transistor so that a gate-source voltage of the second transistor is offset from a threshold voltage of the second transistor and the second transistor operates in weak inversion mode.

2. The amplifier of claim 1, wherein the first bias circuit comprises:

a third transistor coupled between the supply voltage and the gate of the first transistor;

a fourth transistor coupled between the gate of the first transistor and the reference voltage; and a reference circuit coupled to gates of the third and the fourth transistors to apply a first voltage to the gate of the third transistor and a second voltage to the gate of the fourth transistor.

3. The amplifier of claim 2, further comprising a fifth transistor connected between the first transistor and the output node, wherein the fifth transistor has the same conductivity type as the first transistor and has a gate coupled to the gate of the fourth transistor.

4. The amplifier of claim 1 further comprising a first capacitor and a second capacitor, wherein the first capacitor is coupled between the gate of the first transistor and the input node, and the second capacitor is coupled between the gate of the second transistor and the input node.

5. The amplifier of claim 1, wherein:

the first bias circuit limits maximums in an AC component of a first gate voltage which is applied to the gate of the first transistor; and the second bias circuit limits minimums in an AC component of a second gate voltage which is applied to the gate of the second transistor.

6. An amplifier comprising:

an input node;

a first transistor and a second transistor connected in series between a supply voltage and a reference voltage, each of the first and second transistors having a gate coupled to the input node, wherein the first transistor has a conductivity type that is complementary to that of the second transistor;

an output node between the first and second transistors;

a first bias circuit coupled to the gate of the first transistor, wherein the first bias circuit biases the first transistor in weak inversion mode; and a second bias circuit coupled to the gate of the second transistor, wherein the second bias circuit biases the second transistor in weak inversion mode, the first bias circuit comprising:

a third transistor coupled between the supply voltage and the gate of the first transistor;

a fourth transistor coupled between the gate of the first transistor and the reference voltage; and a reference circuit coupled to gates of the third and the fourth transistors to apply a first voltage to the gate of the third transistor and a second voltage to the gate of the fourth transistor, wherein the reference circuit comprises:

a fifth transistor and a sixth transistor connected in series, wherein a gate and a drain of the fifth transistor are coupled to the gate of the third transistor, and a gate and a drain of the sixth transistor are coupled to the gate of the fourth transistor; and a constant current source which controls the current through the fifth and sixth transistors.

7. The amplifier of claim 6, wherein the first, third, fourth, fifth, and sixth transistors are P-channel transistors.

8. The amplifier of claim 7, wherein the second bias circuit comprises:

a seventh transistor coupled between the supply voltage and the gate of the second transistor;

a eighth transistor coupled between the gate of the second transistor and the reference voltage; and a second reference circuit coupled to gates of the seventh and eight transistors to apply a third voltage to the gate of the seventh transistor and a fourth voltage to the gate of the eight transistor.

9. The amplifier of claim 8, wherein the second reference circuit comprises:

a ninth and tenth transistors connected in series, wherein a gate and a drain of the ninth transistor are coupled to the gate of the seventh transistor, and a gate and drain of the tenth transistor are coupled to the gate of the eighth transistor; and a second constant current source which controls the current through the ninth and tenth transistors.

10. The amplifier of claim 9, wherein the second, seventh, eighth, ninth, and tenth transistors are N-channel transistors.

11. The amplifier of claim 8, wherein the second reference circuit comprises a ninth and tenth transistors connected in series, wherein:

a gate and a drain of the ninth transistor are coupled to the gate of the seventh transistor;

a gate and a drain of the tenth transistor are coupled to the gate of the eighth transistor; and the constant current source controls the current through the ninth and tenth transistors.

12. The amplifier of claim 11, wherein the second, seventh, eighth, ninth, and tenth transistors are N-channel transistors.

13. An amplifier comprising:

an input node;

a first transistor and a second transistor, each having a gate coupled to the input node, wherein the first and second transistors are coupled in series between a supply voltage and a reference voltage, and the first transistor has a conductivity type that is complementary to that of the second transistor;

an output node between the first and second transistors; and a first bias-and-clamp circuit coupled to the gate of the first transistor, wherein the first bias-and-clamp circuit comprises:

a third transistor coupled between the supply voltage and the gate of the first transistor;

a fourth transistor coupled between the gate of the first transistor and the reference voltage; and a reference circuit coupled to gates of the third and fourth transistors to apply a first voltage to the gate of the third transistor and a second voltage to the gate of the fourth transistor, wherein the reference circuit comprises:

a fifth and sixth transistors connected in series, wherein a gate and a drain of the fifth transistor are coupled to the gate of the third transistor, and a gate and a drain of the sixth transistor are coupled to the gate of the fourth transistor; and a constant current source which controls the current through the fifth and sixth transistors.

14. The amplifier of claim 13, wherein the first, third, fourth, fifth, and sixth transistors have the same conductivity type.

15. The amplifier of claim 14, further comprising a second bias-and-clamp circuit which comprises:

a seventh transistor coupled between the supply voltage and the gate of the second transistor;

a eighth transistor coupled between the gate of the second transistor and the reference voltage; and a second reference circuit coupled to gates of the seventh and eight transistors to apply a third voltage to the gate of the seventh transistor and a fourth voltage to the gate of the eight transistor.

16. The amplifier of claim 15, wherein the second reference circuit comprises:

a ninth transistor and a tenth transistor connected in series, wherein a gate and a drain of the ninth transistor are coupled to the gate of the seventh transistor, and a gate and a drain of the tenth transistor are coupled to the gate of the eighth transistor; and a second constant current source which controls the current through the ninth and tenth transistors.

17. The amplifier of claim 16, wherein the second, seventh, eighth, ninth, and tenth transistors have the same conductivity type.

18. The amplifier of claim 15, wherein the second reference circuit comprises ninth and tenth transistors connected in series, wherein:

a gate and a drain of the ninth transistor are coupled to the gate of the seventh transistor;

a gate and a drain of the tenth transistor are coupled to the gate of the eighth transistor; and the constant current source controls the current through the ninth and tenth transistors.

19. The amplifier of claim 18, wherein the first, third, fourth, fifth and sixth transistors have a first conductivity type, and the second, seventh, eighth, ninth, and tenth transistors have a second conductivity type.

20. An amplifier comprising:

an input node;

a first transistor and a second transistor, each having a gate coupled to the input node, wherein the first and second transistors are coupled in series between a supply voltage and a reference voltage, and the first transistor has a conductivity type that is complementary to that of the second transistor;

an output node between the first and second transistors; and a first bias-and-clamp circuit coupled to the gate of the first transistor, wherein the first bias-and-clamp circuit comprises:
- a third transistor coupled between the supply voltage and the gate of the first transistor;
- a fourth transistor coupled between the gate of the first transistor and the reference voltage; and
- a reference circuit coupled to gates of the third and fourth transistors to apply a first voltage to the gate of the third transistor and a second voltage to the gate of the fourth transistor; and
- a fifth transistor connected between the first transistor and the output node, wherein the fifth transistor has the same conductivity type as the first transistor and has a gate coupled to the gate of the fourth transistor.

21. An amplifier comprising:

an input node;

a first transistor and a second transistor connected in series between a supply voltage and a reference voltage, each of the first and second transistors having a gate coupled to the input node;

an output voltage between the first and second transistors;

a third transistor coupled between the supply voltage and the gate of the first transistor;

a fourth transistor coupled between the gate of the first transistor and the reference voltage;

a fifth transistor and a sixth transistor connected in series, wherein a gate and a drain of the fifth transistor are coupled to the gate of the third transistor, and a gate and a drain of the sixth transistor are coupled to the gate of the fourth transistor; and a constant current source which controls the current through the fifth and sixth transistors.

22. The amplifier of claim 21, further comprising:

a seventh transistor coupled between the supply voltage and the gate of the second transistor;

an eighth transistor coupled between the gate of the second transistor and the reference voltage;

a ninth transistor and a tenth transistor connected in series, wherein a gate and a drain of the ninth transistor are coupled to the gate of the seventh transistor, and a gate and a drain of the tenth transistor are coupled to the gate of the eighth transistor; and a second constant current source which controls a current through the ninth and tenth transistors.

23. The amplifier of claim 21, further comprising:

a seventh transistor coupled between the supply voltage and the gate of the second transistor;

an eighth transistor coupled between the gate of the second transistor and the reference voltage; and a ninth transistor and a tenth transistor connected in series, wherein a gate and a drain of the ninth transistor are coupled to the gate of the seventh transistor, and a gate and a drain of the tenth transistor are coupled to the gate of the eighth transistor, wherein the constant current source which controls the current through the fifth and sixth transistor and also controls a current through the ninth and tenth transistors.

* * * * *

UNITED STATES PATENT AND TRADEMARK OFFICE
CERTIFICATE OF CORRECTION

PATENT NO.   :   5,568,093
DATED        :   October 22, 1996
INVENTOR(S)  :   Reuven Holzer It is certified that error appears in the above-identified patent and that said Letters Patent is hereby corrected as shown below:

Col. 1, line 66, and Col. 2, line 11, delete "umbalanced" and insert --unbalanced--.

Signed and Sealed this

Fifteenth Day of April, 1997

Attest:

BRUCE LEHMAN

*Attesting Officer*   *Commissioner of Patents and Trademarks*